US008250431B2

(12) United States Patent
Yang et al.

(10) Patent No.: US 8,250,431 B2
(45) Date of Patent: Aug. 21, 2012

(54) SYSTEMS AND METHODS FOR PHASE DEPENDENT DATA DETECTION IN ITERATIVE DECODING

(75) Inventors: Shaohua Yang, Santa Clara, CA (US); Zongwang Li, San Jose, CA (US); Weijun Tan, Longmont, CO (US); Kelly Fitzpatrick, Sudbury, MA (US)

(73) Assignee: LSI Corporation, Milpitas, CA (US)

( * ) Notice: Subject to any disclaimer, the term of this patent is extended or adjusted under 35 U.S.C. 154(b) by 611 days.

(21) Appl. No.: 12/512,235

(22) Filed: Jul. 30, 2009

(65) Prior Publication Data

US 2011/0029837 A1 Feb. 3, 2011

(51) Int. Cl.
*H03M 13/00* (2006.01)

(52) U.S. Cl. ........ 714/755; 714/758; 714/786; 714/752; 714/763; 714/780; 714/794; 714/795; 375/262; 375/341

(58) Field of Classification Search .................. 714/755, 714/786, 752, 758, 763, 780, 794–795; 375/262, 375/341

See application file for complete search history.

(56) References Cited

U.S. PATENT DOCUMENTS

| | | |
|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A | 4/1996 | Janku et al. |
| 5,612,964 A | 3/1997 | Haraszti |
| 5,701,314 A | 12/1997 | Armstrong et al. |
| 5,717,706 A | 2/1998 | Ikeda |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |

(Continued)

FOREIGN PATENT DOCUMENTS

EP 2 083 520 7/2009

(Continued)

OTHER PUBLICATIONS

Casado et al., Multiple-rate low-density parity-check codes with constant blocklength, IEEE Transations on Communications, Jan. 2009, vol. 57, pp. 75-83.

(Continued)

*Primary Examiner* — Guy Lamarre
(74) *Attorney, Agent, or Firm* — Hamilton, DeSanctis & Cha (57) ABSTRACT

Various embodiments of the present invention provide systems and methods for data processing. For example, a data processing circuit is disclosed that includes a first data detection circuit that applies a phase dependent data detection algorithm to a data set such that a first output of the first data detection circuit varies depending upon a phase of the data set presented to the first data detection circuit. A first phase of the data set is presented to the first data detection circuit. The circuits further include a decoder circuit that applies a decoding algorithm to the first output to yield a decoded output, and a phase shift circuit that phase shifts the decoded output such that a second phase of the data set is provided as a phase shifted output. A second detection circuit applies a phase dependent data detection algorithm to the phase shifted output such that a second output of the second data detection circuit varies from the first output at least in part due to a different phase of the data set presented to the second data detection circuit.

21 Claims, 6 Drawing Sheets

U.S. PATENT DOCUMENTS

| | | | |
|---|---|---|---|
| 6,005,897 | A | 12/1999 | McCallister et al. |
| 6,023,783 | A | 2/2000 | Divsalar et al. |
| 6,029,264 | A | 2/2000 | Kobayashi et al. |
| 6,041,432 | A | 3/2000 | Ikeda |
| 6,097,764 | A | 8/2000 | McCallister et al. |
| 6,216,251 | B1 | 4/2001 | McGinn |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,438,717 | B1 | 8/2002 | Butler et al. |
| 6,473,878 | B1 | 10/2002 | Wei |
| 6,625,775 | B1 | 9/2003 | Kim |
| 6,671,404 | B1 | 12/2003 | Kawatani et al. |
| 6,748,034 | B2 | 6/2004 | Hattori et al. |
| 6,757,862 | B1 | 6/2004 | Marianetti |
| 6,788,654 | B1 | 9/2004 | Hashimoto et al. |
| 6,810,502 | B2 | 10/2004 | Eidson |
| 6,986,098 | B2 | 1/2006 | Poeppelman |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,093,179 | B2 | 8/2006 | Shea |
| 7,184,486 | B1 | 2/2007 | Wu et al. |
| 7,191,378 | B2 | 3/2007 | Eroz et al. |
| 7,203,887 | B2 | 4/2007 | Eroz et al. |
| 7,257,764 | B2 | 8/2007 | Suzuki et al. |
| 7,310,768 | B2 | 12/2007 | Eidson et al. |
| 2002/0106043 | A1* | 8/2002 | Sasaki ............ 375/355 |
| 2003/0086505 | A1* | 5/2003 | Nguyen et al. ......... 375/279 |
| 2004/0098659 | A1 | 5/2004 | Bjerke et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0248435 | A1 | 11/2006 | Haratsch |
| 2007/0011569 | A1 | 1/2007 | Casado et al. |
| 2007/0047635 | A1 | 3/2007 | Stojanovic et al. |
| 2007/0286270 | A1 | 12/2007 | Huang et al. |
| 2008/0049825 | A1 | 2/2008 | Chen et al. |
| 2008/0168330 | A1 | 7/2008 | Graef et al. |
| 2009/0185643 | A1 | 7/2009 | Fitzpatrick et al. |

FOREIGN PATENT DOCUMENTS

| | | |
|---|---|---|
| WO | WO 2006/016751 | 2/2006 |
| WO | WO 2006/091797 | 8/2007 |
| WO | WO 2010/126482 | 4/2010 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SCRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 20.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. On Circuits, Regular Papers, vol. 5, No. 4, pp. 766-775, Apr. 2005.

* cited by examiner

SYSTEMS AND METHODS FOR PHASE DEPENDENT DATA DETECTION IN ITERATIVE DECODING

BACKGROUND OF THE INVENTION

The present inventions are related to systems and methods for transferring information, and more particularly to systems and methods for performing data detection on a received data set.

Various systems rely on transferring information between a transmitter and a receiver. For example, a wireless transmission system includes a transmission device that sends information across a wireless transmission medium to a receiver that attempts to recreate the originally transferred information. As another example, a hard disk drive transmits or writes data to a storage medium, and later accesses the data from the storage medium. In both cases, one or more data detector circuits may be utilized to detect the received data in an attempt to recreate the originally transmitted information. In some cases, uncorrected errors remain in the received data and the originally transmitted information may be lost.

Hence, for at least the aforementioned reasons, there exists a need in the art for advanced systems and methods for processing received data.

BRIEF SUMMARY OF THE INVENTION

The present inventions are related to systems and methods for transferring information, and more particularly to systems and methods for performing data detection on a received data set.

Some embodiments of the present invention provide data processing circuits. Such circuits include a first data detection circuit that applies a phase dependent data detection algorithm to a data set such that a first output of the first data detection circuit varies depending upon a phase of the data set presented to the first data detection circuit. A first phase of the data set is presented to the first data detection circuit. The circuits further include a phase shift circuit that phase shifts a derivative of the first output such that a second phase of the data set is provided as a phase shifted output; and a second data detection circuit that applies a phase dependent data detection algorithm to the phase shifted output such that a second output of the second data detection circuit varies from the first output at least in part due to a different phase of the data set presented to the second data detection circuit.

Various embodiments of the present invention provide data processing circuits. Such circuits include a first data detection circuit that applies a phase dependent data detection algorithm to a data set such that a first output of the first data detection circuit varies depending upon a phase of the data set presented to the first data detection circuit. A first phase of the data set is presented to the first data detection circuit. The circuits further include a decoder circuit that applies a decoding algorithm to the first output to yield a decoded output, and a phase shift circuit that phase shifts the decoded output such that a second phase of the data set is provided as a phase shifted output. A second detection circuit applies a phase dependent data detection algorithm to the phase shifted output such that a second output of the second data detection circuit varies from the first output at least in part due to a different phase of the data set presented to the second data detection circuit.

In some instances of the aforementioned embodiments, the first data detection circuit is distinct from the second data detection circuit. In other instances of the aforementioned embodiments, the first data detection circuit and the second data detection circuit are implemented as a single data detection circuit. In particular instances of the aforementioned embodiments, the decoder is a low density parity check decoder, and the first data detection circuit is a SOVA detector circuit or a MAP detector circuit.

In some instances of the aforementioned embodiments, the first data detection circuit and the second data detection circuit offer two phase dependent detection processes. In other instances of the aforementioned embodiments, the first data detection circuit and the second data detection circuit offer four phase dependent detection processes. In various instances of the aforementioned embodiments, the phase shift circuit is a delay circuit. The delay circuit may be a variable delay circuit operable to cause a data input to be shifted by a variable amount. In particular instance, the circuit further includes a phase align circuit that is operable to align the first output to a decoder boundary prior to presenting the first output to the decoder circuit. In one particular case, the decoder boundary is a 4T boundary. In some cases, the phase align circuit is a variable delay circuit.

Other embodiments of the present invention provide methods for data processing. The methods include receiving a data set and performing a first data detection on the data set. The first data detection is a phase dependent data detection resulting in a first output that varies depending upon a phase of the data set to which the first data detection is applied. The first data detection is applied to a first phase of the data set. A data decode is performed on the first output to yield a decoded output, and a phase shift is applied to the decoded output such that a second phase of the data set is provided as a phase shifted output. A second data detection is performed on the phase shifted output. The second data detection is a phase dependent data detection resulting in a second output that varies depending upon a phase of a presented input.

In some instances of the aforementioned embodiments, the methods further include phase aligning the first output such that the first output is aligned to a decoder boundary prior to presenting the first output to the decoder circuit. In some cases, phase aligning the first output includes applying a variable delay to the first output. In particular instances of the aforementioned embodiments, the first data detection and the second data detection are done using the same data detection circuit. In such cases, the methods may further include phase shifting the data set to align with a particular phase prior to performing the first data detection.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for performing data detection on a received data set.

Various embodiments of the present invention perform data processing that includes processing through a series of data detector circuits and/or through successive passes through the same data detector circuit. The data detector circuits are phase dependent such that one phase of a sample set is treated differently than another phase of the sample set by the same detector circuit. As an example, a detector that utilizes a full rate data detection algorithm applied to a higher radix trellis will exhibit some phase dependence. For example, a ½ rate data detector uses a radix-4 trellis where there are four branches leaving and entering each state, and each branch corresponds to 2T, where T represents a bit period. As another example, a ¼ rate data detector uses a radix-16 trellis where there are sixteen branches leaving and entering each state, and each branch corresponds to 4T. Higher order radix detectors are also possible where the number of bits per branch is N, and the radix is $2^N$. The radix-$2^N$ detector breaks the sampled data set into N branch positions and performs a position-dependent detection algorithm on the data set. On successive detector iterations, the data set is introduced in different phases to obtain different treatment for each of the branch positions. As used herein, the term "phase" is used to describe the location or position of the data set relative to the different data detection algorithms applied by the data detector circuit. Thus, for example, where the data set is broken into two positions (i.e., bit 0 is in the A position, bit 1 is in the B position, bit 2 is in the A position, bit 3 is in the B position, etc), during the first data detection iteration, bit 0 is treated by a first algorithm or branch of the data detector circuit and bit 1 is treated by a second algorithm or branch of the data detector circuit. In a subsequent data detection iteration, bit 0 is treated by the second algorithm or branch of the data detector circuit and bit 1 is treated by the first algorithm or branch of the data detector circuit.

As an example, in some embodiments of the present invention, detector circuits are utilized that operate on four samples at a time (i.e. a 4T detector) with a first detection process or algorithm applied to the first and third samples, and a second detection process or algorithm applied to the second and fourth samples. Thus, in this case, the output of the detector circuit varies depending upon whether the particular input is in an odd phase or an even phase, and a change in the phases yields a different output from the detector circuit. It should be noted that the above example would work equally well for a detector that worked on two samples at a time (i.e., a 2T detector). In other embodiments of the present invention, detector circuits are utilized that operate on four samples at a time with a first detection process or algorithm applied to the first sample, a second detection process or algorithm applied to the second sample, a third detection process or algorithm applied to the third sample, and a fourth detection process applied to the fourth sample. Thus, in this case, the output of the detector circuit varies depending upon whether the particular input is in the first, second, third or fourth phase, and a change in the phases yields a different output from the detector circuit. It should be noted that most of the discussion provided herein is focused on 4T data detector circuits that offer either two or four phase dependent paths, but that other data detectors may be used including, but not limited to, 2T and 8T data detectors offering some number of data dependent paths.

In the embodiments, the phase of the samples is shifted for successive passes through the detector circuit(s). For example, in systems where three instances of the same detector circuit offering two distinct phase treatments are implemented, one phase of the input data may be applied to the first detector circuit, a different phase of the input data may be applied to the second detector circuit, and yet a different phase of the input data may be applied to the third detector circuit. In this way, a different detection process or algorithm is applied on each successive pass, with a corresponding change in the detector output. Such a system perturbation heightens the possibility of data convergence for where certain types of errors are exhibited by the data input.

Figure 1:
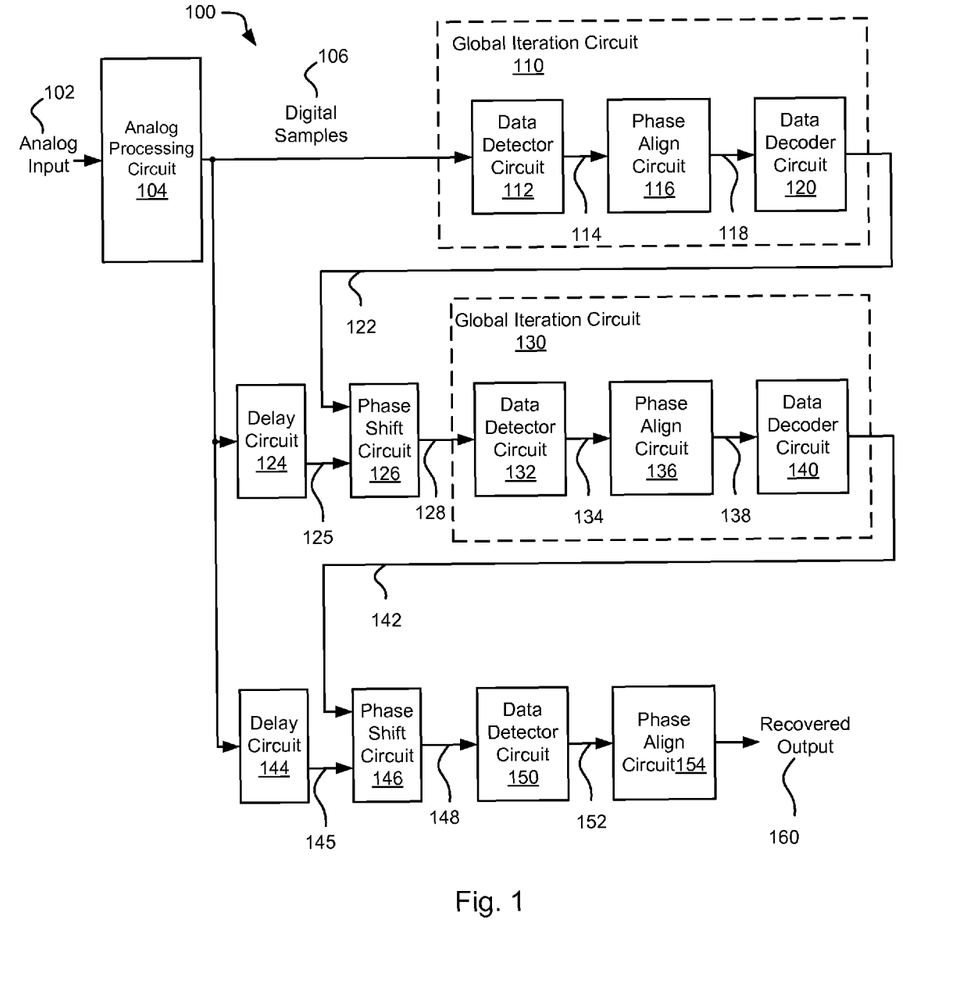
FIG. 1 depicts a data processing circuit including a multi-phase data detection circuit in accordance with some embodiments of the present invention.

Turning to FIG. 1, a data processing circuit 100 including a multi-phase data detection circuit is depicted in accordance with some embodiments of the present invention; Data processing circuit 100 includes an analog to digital converter 104 that receives an analog input 102 and provides a series of data samples 106. Analog input 102 may be received from an analog processing circuit (not shown) based upon information derived from an original data source (not shown). As an example, the original data source may be a storage medium where data processing circuit 100 is implemented as part of a hard disk drive. As another example, the original data source may be a transmission medium where data processing circuit 100 is implemented as part of a transmission system. Based upon the disclosure provided herein, one of ordinary skill in the art will recognize a variety of original data sources that may be used in relation to different embodiments of the present invention.

Digital samples 106 are provided to a global iteration circuit 110. These samples may be provided directly or via some intervening circuitry such as a digital filter (not shown). Global iteration circuit 110 includes a data detector circuit 112 that provides a detector output 114 to a phase align circuit 116. Data detector circuit 112 may be any type of data detector known in the art including, but not limited to, a soft output Viterbi algorithm detector (SOVA) or a maximum a posteriori (MAP) detector. Data detector circuit 112 applies a data detection process that is phase dependent. For example, in some embodiments of the present invention, data detector circuit 112 operates on four samples at a time with a first detection process or algorithm applied to the first and third samples, and a second detection process or algorithm applied to the second and fourth samples. Thus, in this case, detector output 114 varies depending upon whether the particular input is in an odd phase or an even phase, and a change in the phases yields a different output from data detector circuit 112. In other embodiments of the present invention, data detector circuit 112 operates on four samples at a time with a first detection process or algorithm applied to the first sample, a second detection process or algorithm applied to the second sample, a third detection process or algorithm applied to the third sample, and a fourth detection process applied to the fourth sample. Thus, in this case, detector output 114 varies depending upon whether the particular input is in the first, second, third or fourth phase, and a change in the phases yields a different output from data detector circuit 112. One example of a data detector circuit that may be used in relation to different embodiments of the present invention is disclosed in U.S. patent application Ser. No. 12/017,765 entitled "Methods and Apparatus for MAP Detection with Reduced Complexity" and filed Jan. 22, 2008 by Fitzpatrick et al. The aforementioned patent application is assigned to an entity common hereto, and the entirety of the aforementioned patent application is incorporated herein by reference for all purposes. Based upon the disclosure provided herein, one of ordinary skill in the art will recognize a variety of data detector circuits that may be used in relation to different embodiments of the present invention. Based on the disclosure provided herein, one of ordinary skill in the art will recognize a variety of data detectors offering phase dependent treatment of an input set that may be used in accordance with different embodiments of the present invention.

Phase align circuit 116 receives detector output 114 and provides a decoder input 118 that is aligned with a particular phase relative to a sync mark or other location indicator. For example, in some embodiments of the present invention, decoder input 118 is aligned on a 4T boundary. In some embodiments of the present invention, phase align circuit 116 is implemented as a delay circuit that is capable of delaying decoder input 118 such that it is aligned with a defined boundary. Thus, for example, where decoder input 118 is to be aligned on a 4T boundary and phase align circuit 116 receives an input that is a 3T phase, phase align circuit 116 delays the input by 1T. As another example, where phase align circuit 116 receives an input that is a 2T phase, phase align circuit 116 delays the input by 2T. As yet another example, where phase align circuit 116 receives an input that is a 1T phase, phase align circuit 116 delays the input by 3T. As yet another example, where phase align circuit 116 receives an input that is a 4T phase, phase align circuit 116 merely passes the input through as decoder input 118. It should be noted that phase alignments other than 4T may be provided at decoder input 118 with corresponding modifications to the delays offered by phase align circuit 116.

A data decoder circuit 120 receives decoder input 118, applies a decoding algorithm thereto, and provides a decoded output 122. Data decoder circuit 120 may be any decoder circuit known in the art including, but not limited to, a low density parity check decoder (LDPC). Based upon the disclosure provided herein, one of ordinary skill in the art will recognize a variety of decoder circuits that may be used in relation to different embodiments of the present invention.

Digital samples 106 are also provided to a delay circuit 124 that delays digital samples to match the latency through global iteration circuit 110 such that the samples are aligned with decoded output 122. These samples may be provided directly or via some intervening circuitry such as a digital filter (not shown). Delay circuit 124 provides a delay output 125. A phase shift circuit 126 receives both delay output 125 and decoded output 122 and provides a phase shifted data output 128 to a global iteration circuit 130. Global iteration circuit 130 includes a data detector circuit 132 that provides a detector output 134 to a phase align circuit 136. Data detector circuit 132 may be the same as data detector circuit 112. Phase shift circuit 126 applies a phase shift to both delay output 125 and decoded output 122 sufficient to ensure that a different phase is presented to data detector circuit 132 than was previously presented to data detector circuit 112.

A phase align circuit 136 receives a detector output 134 from data detector circuit 132 and provides a decoder input 138 that is aligned with a particular phase relative to a sync mark or other location indicator. This alignment is similar to that discussed above in relation to decoder input 118. A data decoder circuit 140 receives decoder input 138, applies a decoding algorithm thereto, and provides a decoded output 142. Data decoder circuit 140 may be any decoder circuit known in the art including, but not limited to, a low density parity check decoder (LDPC). Based upon the disclosure provided herein, one of ordinary skill in the art will recognize a variety of decoder circuits that may be used in relation to different embodiments of the present invention.

Digital samples 106 are also provided to a delay circuit 144 that delays digital samples to match the latency through global iteration circuit 110, phase shift circuit 126, and global iteration circuit 130 such that the samples are aligned with decoded output 142. These samples may be provided directly or via some intervening circuitry such as a digital filter (not shown). Delay circuit 144 provides a delay output 145. A phase shift circuit 146 receives both delay output 145 and decoded output 142 and provides a phase shifted data output 148 to a data detector circuit 150. Data detector circuit 150 may be the same as data detector circuit 112 and/or data detector circuit 132. Phase shift circuit 146 applies a phase shift to both delay output 145 and decoded output 142 sufficient to ensure that a different phase is presented to data detector circuit 150 than was previously presented to data detector circuit 132, and where possible than the phase previously presented to data detector circuit 112. A phase align circuit 146 receives a detector output 152 from data detector circuit 150 and provides a recovered output 160 that is aligned with a particular phase relative to a sync mark or other location indicator. This alignment is similar to that discussed above in relation to decoder input 118.

By presenting different phases of a data set to successive data detector circuits, different detection processes or algorithms are applied on each successive pass through the successive data detector circuits, with a corresponding change in the output of the data detector circuits. Such a system perturbation heightens the possibility of data convergence for where certain types of errors are exhibited by the data input.

Figure 2A:
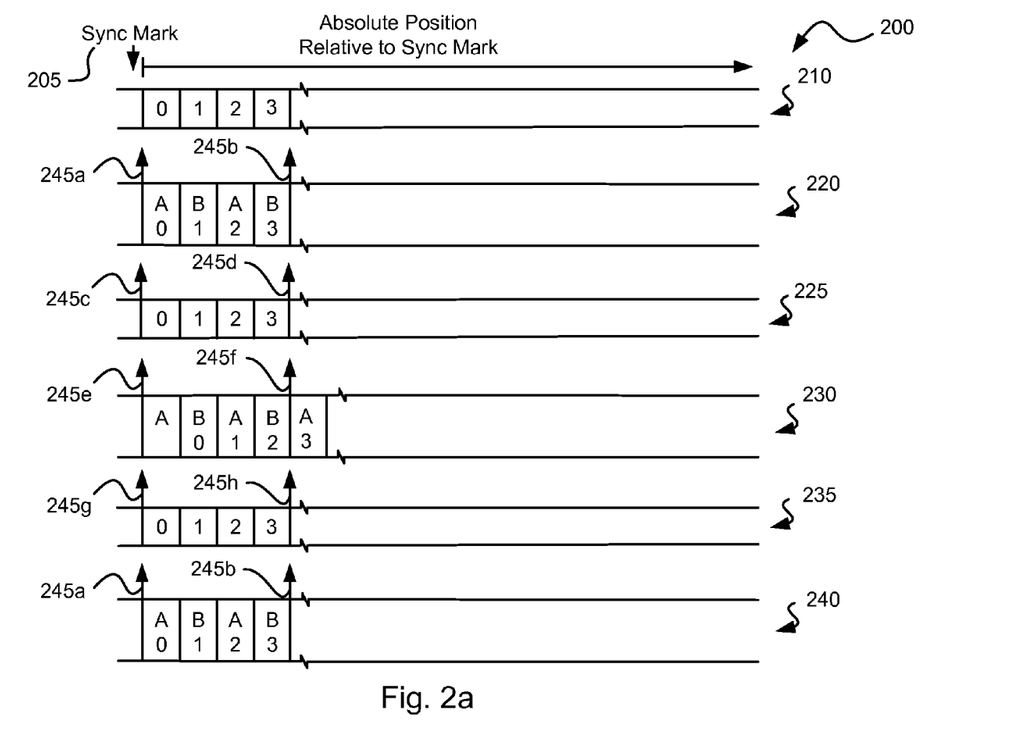
FIGS. 2a, 2b and 2c are graphic depictions of phase shifted data processing in accordance with some embodiments of the present invention.

Turning to FIG. 2a, graphic depiction 200 of phase shifting of data during processing through successive data detector circuits is shown in accordance with some embodiments of the present invention. In particular, graphic depiction 200 shows the situation where three successive data detector circuits (or iterations through the same detector circuits) are used that each offer two phase dependent detection processes or algorithms. As shown, a series of data samples 210 are numbered with their absolute positions relative to a sync mark 205. Data samples 210 are presented to a data detector circuit represented by a series of samples 220. The data detector circuit offers two phase dependent detection processes or algorithms labeled as A and B. As shown, data sample 0 from data samples 210 is processed using the A detection process, and data sample 1 from data samples 210 is processed using the B detection process. The A and B processes are used alternatively through the rest of data samples 220 as shown.

Once the processing by the data detector circuit is complete, the data is phase aligned prior to being introduced to a decoder circuit. The phase alignment is depicted as samples 225. In this case, phase alignment is done on 4T boundaries 245. It should be noted that other phase alignments may be used in accordance with different embodiments of the present invention. As the output of the data detection process (samples 220) are already aligned on 4T boundaries, a 0T delay is added to achieve the desired phase alignment prior to performing the decoding process. It should also be noted that the depicted 4T boundaries are not consecutive or coincident 4T boundaries, but rather may be separated by hundreds or even thousands of cycles depending upon the time required to process through the data detector circuits and data decoder circuits. Thus, for example, the 4T boundary 245*b* is four cycles after 4T boundary 245*a*, but 4T boundary 245*c* may be many hundreds or thousands of cycles after 4T boundary 245*b*.

Once the processing by the decoder circuit is complete, the data is phase shifted prior to being introduced to a detector circuit (either another detector circuit or another iteration through the same detector circuit). The phase shift is depicted as samples 230. The phase shift is designed to ensure that a different phase dependent detection process is applied to a given sample when compared with prior detection process (i.e., the detection process applied to samples 220). In this case, the samples are delayed by 1T so that data sample 0 from data samples 210 is processed using the B detection process, and data sample 1 from data samples 210 is processed using the A detection process. This is the reverse of the detection processes that were applied to samples 220. The A and B processes are similarly reversed for the other samples of data samples 210.

Once the processing by the data detector circuit is complete, the data is phase aligned prior to being introduced to a decoder circuit. The phase alignment is depicted as samples 225. In this case, phase alignment is done on 4T boundaries 245. Again, it should be noted that other phase alignments may be used in accordance with different embodiments of the present invention. As the output of the data detection process (samples 230) exhibit a 1T phase alignment, 3T delay is added to achieve the desired phase alignment prior to performing the decoding process.

Once the processing by the decoder circuit is complete, the data is phase shifted prior to being introduced to a detector circuit (either another detector circuit or another iteration through the same detector circuit). The phase shift is depicted as samples 240. The phase shift is designed to ensure that a different phase dependent detection process is applied to a given sample when compared with prior detection process (i.e., the detection process applied to samples 230). In this case, the samples are already phase aligned such that a different phase dependent process will be applied. In particular, data sample 0 from data samples 210 is processed using the A detection process, and data sample 1 from data samples 210 is processed using the B detection process. This is the reverse of the detection processes that were applied to samples 230. The A and B processes are similarly reversed for the other samples of data samples 220. Accordingly, a 0T phase shift is applied.

As shown, for each successive data detection step, a different phase of the data is presented to the data detector. By presenting different phases of a data set to successive data detection steps, different detection processes or algorithms are applied on each successive pass through the successive data detector circuits, with a corresponding change in the output of the data detector circuits. Such a system perturbation heightens the possibility of data convergence for where certain types of errors are exhibited by the data input. It should be noted that the graphical depiction of FIG. 2*a* is merely exemplary and that one of ordinary skill in the art based upon the disclosure provided herein will recognize a number of other examples of phase shifting and alignment that may be performed in relation to different embodiments of the present invention.

Figure 2B:
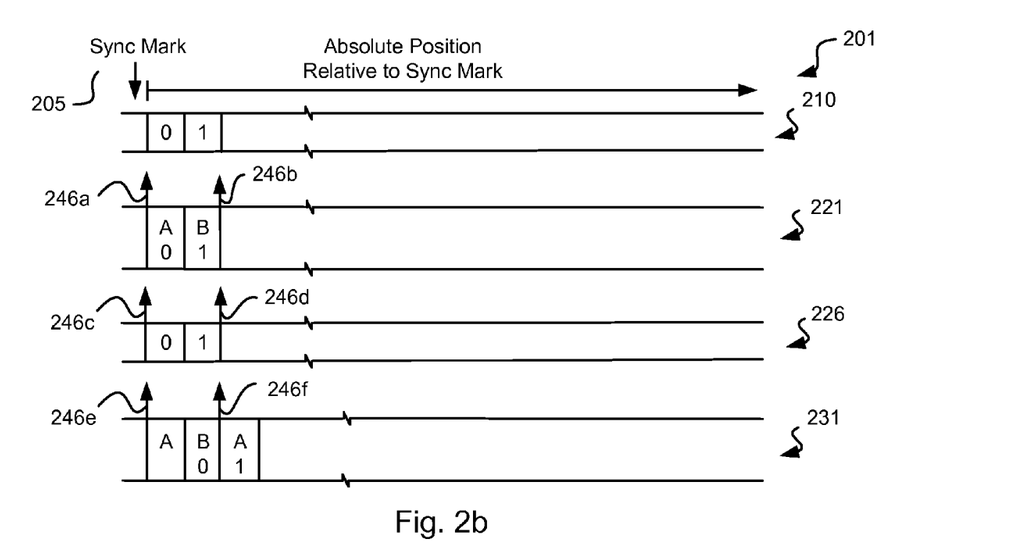

It should be noted that while FIG. 2*a* is described in relation to a 4T detector operating on 4T boundaries, that it could also be applied to a 2T detector operating on 2T boundaries. In such a case, any shifting is aligned to 2T boundaries instead of the 4T boundaries 245 as shown. An example of a 2T detector is shown in FIG. 2*b* that is a graphic depiction 201 of phase shifting of data during processing through successive data detector circuits is shown in accordance with some embodiments of the present invention. In particular, graphic depiction 201 shows the situation where two successive data detector circuits (or iterations through the same detector circuits) are used that each offer two phase dependent detection processes or algorithms. As shown, a series of data samples 210 are numbered with their absolute positions relative to a sync mark 205. Data samples 210 are presented to a data detector circuit represented by a series of samples 221. The data detector circuit offers two phase dependent detection processes or algorithms labeled as A and B. As shown, data sample 0 from data samples 210 is processed using the A detection process, and data sample 1 from data samples 210 is processed using the B detection process. The A and B processes are used alternatively through the rest of data samples 221 as shown.

Once the processing by the data detector circuit is complete, the data is phase aligned prior to being introduced to a decoder circuit. The phase alignment is depicted as samples 226. In this case, phase alignment is done on 2T boundaries 246. It should be noted that other phase alignments may be used in accordance with different embodiments of the present invention. As the output of the data detection process (samples 221) are already aligned on 2T boundaries, a 0T delay is added to achieve the desired phase alignment prior to performing the decoding process. It should also be noted that the depicted 2T boundaries are not consecutive or coincident 2T boundaries, but rather may be separated by hundreds or even thousands of cycles depending upon the time required to process through the data detector circuits and data decoder circuits. Thus, for example, the 2T boundary 246*b* is two cycles after 2T boundary 246*a*, but 2T boundary 246*c* may be many hundreds or thousands of cycles after 2T boundary 246*b*.

Once the processing by the decoder circuit is complete, the data is phase shifted prior to being introduced to a detector circuit (either another detector circuit or another iteration through the same detector circuit). The phase shift is depicted as samples 231. The phase shift is designed to ensure that a different phase dependent detection process is applied to a given sample when compared with prior detection process (i.e., the detection process applied to samples 221). In this case, the samples are delayed by 1T so that data sample 0 from data samples 210 is processed using the B detection process, and data sample 1 from data samples 210 is processed using the A detection process. This is the reverse of the detection processes that were applied to samples 221. The A and B processes are similarly reversed for the other samples of data samples 210.

As shown, for each successive data detection step, a different phase of the data is presented to the data detector. By presenting different phases of a data set to successive data detection steps, different detection processes or algorithms are applied on each successive pass through the successive data detector circuits, with a corresponding change in the output of the data detector circuits. Such a system perturbation heightens the possibility of data convergence for where certain types of errors are exhibited by the data input. It should be noted that the graphical depiction of FIG. 2b is merely exemplary and that one of ordinary skill in the art based upon the disclosure provided herein will recognize a number of other examples of phase shifting and alignment that may be performed in relation to different embodiments of the present invention.

Figure 2C:
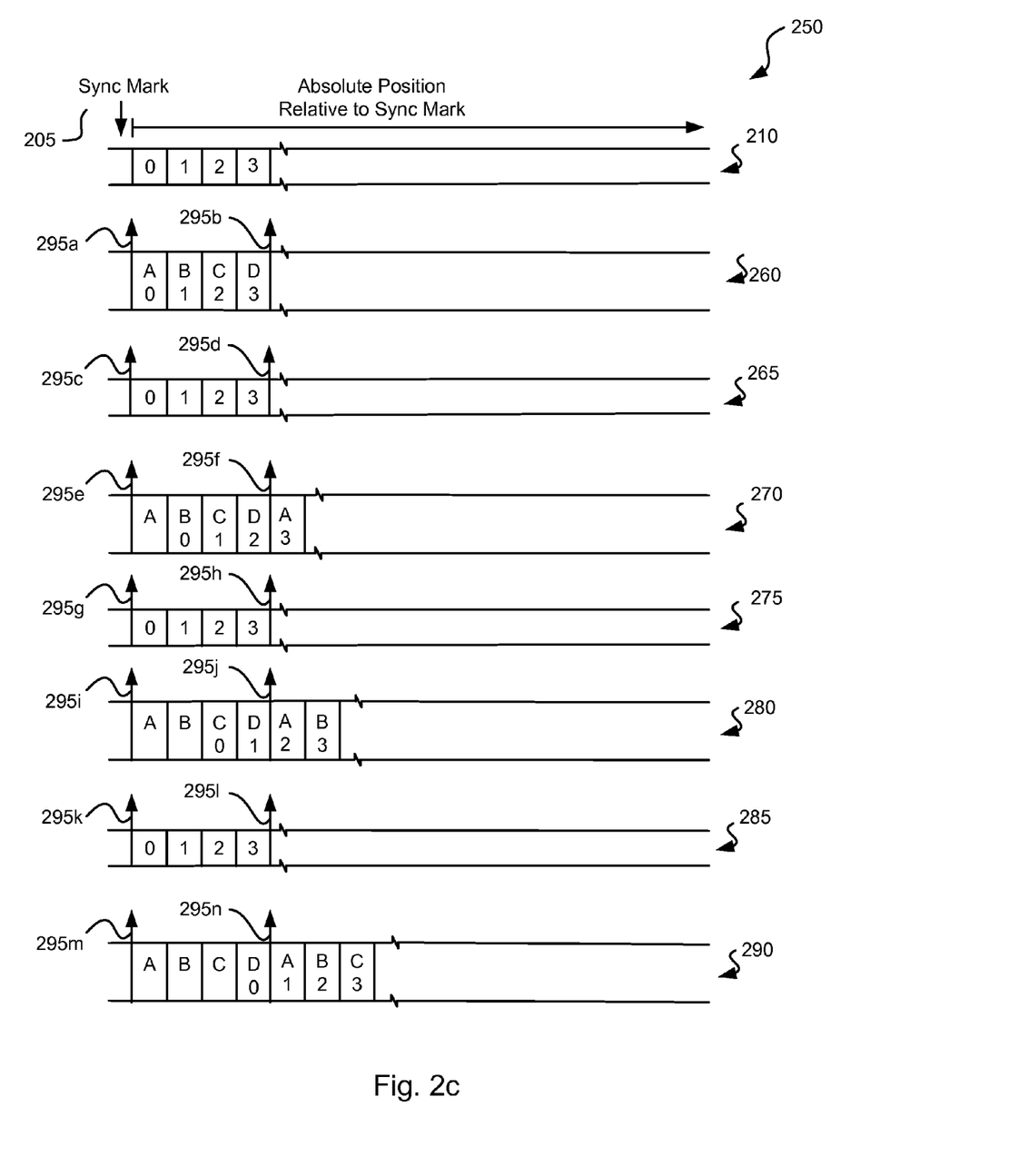

Turning to FIG. 2c, graphic depiction 250 of phase shifting of data during processing through successive data detector circuits is shown in accordance with some embodiments of the present invention. In particular, graphic depiction 250 shows the situation where four successive data detector circuits (or iterations through the same detector circuits) are used that each offer four phase dependent detection processes or algorithms. The data is shown relative to the same series of data samples 210 and sync mark 205 of FIG. 2a. Data samples 210 are presented to a data detector circuit represented by a series of samples 260. The data detector circuit offers four phase dependent detection processes or algorithms labeled as A, B, C and D, respectively. As shown, data sample 0 from data samples 210 is processed using the A detection process, data sample 1 from data samples 210 is processed using the B detection process, data sample 2 from data samples 210 is processed using the C detection process, and data sample 3 from data samples 210 is processed using the D detection process. The A, B, C and D processes are used repeatedly through the rest of data samples 260 as shown.

Once the processing by the data detector circuit is complete, the data is phase aligned prior to being introduced to a decoder circuit. The phase alignment is depicted as samples 265. In this case, phase alignment is done on 4T boundaries 295. It should be noted that other phase alignments may be used in accordance with different embodiments of the present invention. As the output of the data detection process (samples 260) are already aligned on 4T boundaries, a 0T delay is added to achieve the desired phase alignment prior to performing the decoding process. It should also be noted that the depicted 4T boundaries are not consecutive or coincident 4T boundaries, but rather may be separated by hundreds or even thousands of cycles depending upon the time required to process through the data detector circuits and data decoder circuits. Thus, for example, the 4T boundary 295b is four cycles after 4T boundary 295a, but 4T boundary 295c may be many hundreds or thousands of cycles after 4T boundary 295b.

Once the processing by the decoder circuit is complete, the data is phase shifted prior to being introduced to a detector circuit (either another detector circuit or another iteration through the same detector circuit). The phase shift is depicted as samples 270. The phase shift is designed to ensure that a different phase dependent detection process is applied to a given sample when compared with prior detection process (i.e., the detection process applied to samples 260). In this case, the samples are delayed by 1T so that data sample 0 from data samples 210 is processed using the B detection process, data sample 1 from data samples 210 is processed using the C detection process, data sample 2 from data samples 210 is processed using the D detection process, and data sample 3 from data samples 210 is processed using the A detection process. This is shifted forward from the detection processes that were applied to samples 260. The A, B, C and D processes are similarly shifted for the other samples of data samples 210 as shown.

Once the processing by the data detector circuit is complete, the data is phase aligned prior to being introduced to a decoder circuit. The phase alignment is depicted as samples 275. In this case, phase alignment is done on 4T boundaries 295. Again, it should be noted that other phase alignments may be used in accordance with different embodiments of the present invention. As the output of the data detection process (samples 270) exhibit a 1T phase alignment, a 3T delay is added to achieve the desired phase alignment prior to performing the decoding process.

Once the processing by the decoder circuit is complete, the data is phase shifted prior to being introduced to a detector circuit (either another detector circuit or another iteration through the same detector circuit). The phase shift is depicted as samples 280. The phase shift is designed to ensure that a different phase dependent detection process is applied to a given sample when compared with prior detection process (i.e., the detection process applied to samples 270). In this case, the samples are delayed by 2T so that data sample 0 from data samples 210 is processed using the C detection process, data sample 1 from data samples 210 is processed using the D detection process, data sample 2 from data samples 210 is processed using the A detection process, and data sample 3 from data samples 210 is processed using the B detection process. This is shifted forward from the detection processes that were applied to samples 270. The A, B, C and D processes are similarly shifted for the other samples of data samples 210 as shown.

Once the processing by the data detector circuit is complete, the data is phase aligned prior to being introduced to a decoder circuit. The phase alignment is depicted as samples 285. In this case, phase alignment is done on 4T boundaries 295. Again, it should be noted that other phase alignments may be used in accordance with different embodiments of the present invention. As the output of the data detection process (samples 280) exhibit a 2T phase alignment, a 2T delay is added to achieve the desired phase alignment prior to performing the decoding process.

Once the processing by the decoder circuit is complete, the data is phase shifted prior to being introduced to a detector circuit (either another detector circuit or another iteration through the same detector circuit). The phase shift is depicted as samples 290. The phase shift is designed to ensure that a different phase dependent detection process is applied to a given sample when compared with prior detection process (i.e., the detection process applied to samples 280). In this case, the samples are delayed by 3T so that data sample 0 from data samples 210 is processed using the D detection process, data sample 1 from data samples 210 is processed using the A detection process, data sample 2 from data samples 210 is processed using the B detection process, and data sample 3 from data samples 210 is processed using the C detection process. This is shifted forward from the detection processes that were applied to samples 280. The A, B, C and D processes are similarly shifted for the other samples of data samples 210 as shown.

As shown, for each successive data detection step, a different phase of the data is presented to the data detector. By presenting different phases of a data set to successive data detection steps, different detection processes or algorithms are applied on each successive pass through the successive data detector circuits, with a corresponding change in the output of the data detector circuits. Such a system perturbation heightens the possibility of data convergence for where certain types of errors are exhibited by the data input. It should be noted that the graphical depiction of FIG. 2b is merely exemplary and that one of ordinary skill in the art based upon the disclosure provided herein will recognize a number of other examples of phase shifting and alignment that may be performed in relation to different embodiments of the present invention.

Figure 3:
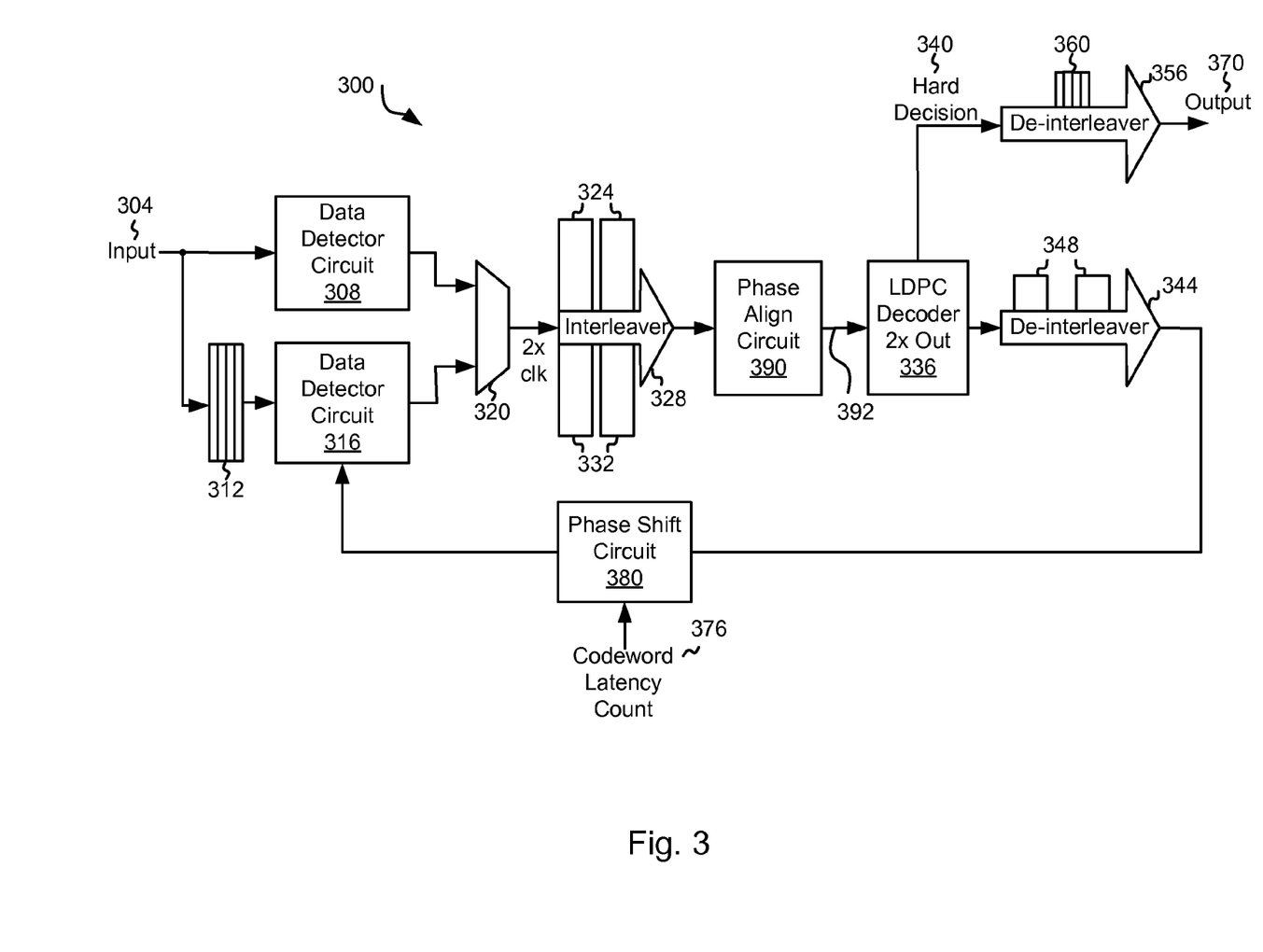
FIG. 3 shows a queuing detection/decoding based data processing circuit including a multi-phase data detection circuit in accordance with various embodiments of the present invention.

Turning to FIG. 3, a queuing detection/decoding circuit 300 including a multi-phase data detection circuit is shown in accordance with various embodiments of the present invention. Queuing detection/decoding circuit 300 includes a data input 304 that is fed to a data detector 308. Data detector 308 may be any type of data detector known in the art including, but not limited to, a soft output Viterbi algorithm detector (SOVA) or a maximum a posteriori (MAP) detector. Data detector 308 applies a data detection process that is phase dependent. For example, in some embodiments of the present invention, data detector 308 operates on four samples at a time with a first detection process or algorithm applied to the first and third samples, and a second detection process or algorithm applied to the second and fourth samples. Thus, in this case, the output of data detector 308 varies depending upon whether the particular input is in an odd phase or an even phase, and a change in the phases yields a different output from data detector 308. In other embodiments of the present invention, data detector 308 operates on four samples at a time with a first detection process or algorithm applied to the first sample, a second detection process or algorithm applied to the second sample, a third detection process or algorithm applied to the third sample, and a fourth detection process applied to the fourth sample. Thus, in this case, the output of data detector 308 varies depending upon whether the particular input is in the first, second, third or fourth phase, and a change in the phases yields a different output from data detector 308. One example of a data detector circuit that may be used in relation to different embodiments of the present invention is disclosed in U.S. patent application Ser. No. 12/017,765 entitled "Methods and Apparatus for MAP Detection with Reduced Complexity". The aforementioned patent application was previously incorporated herein by reference for all purposes. Based upon the disclosure provided herein, one of ordinary skill in the art will recognize a variety of data detector circuits that may be used in relation to different embodiments of the present invention. Based on the disclosure provided herein, one of ordinary skill in the art will recognize a variety of data detectors offering phase dependent treatment of an input set that may be used in accordance with different embodiments of the present invention.

In addition, data input 304 is provided to a input data buffer 312 that is designed to hold a number of data sets received from data input 304. The size of input data buffer 312 may be selected to provide sufficient buffering such that a data set input via data input 304 remains available at least until a first iteration processing of that same data set is complete and the processed data is available in a ping pong buffer 348 (i.e., a queuing buffer) as more fully described below. Input data buffer 312 provides the data sets to a data detector 316. Data detector 316 may be the same as data detector 308.

The output of both data detector 308 and data detector 316 are provided to an interleaver circuit 328 via a multiplexer 320. Such outputs may be, for example, log likelihood ratio values. Interleaver circuit 320 interleaves the output of data detector 308 and separately interleaves the output of data detector 316 using two ping pong buffers 324, 332. One of the buffers in ping pong buffer 324 holds the result of a prior interleaving process of the output from data detector 308 and is unloaded to an LDPC decoder 336 via a phase align circuit 390. Phase align circuit 390 causes a decoder input 392 to be aligned with a particular phase relative to a sync mark. For example, in some embodiments of the present invention, decoder input 392 is aligned on a 4T boundary. In some embodiments of the present invention, phase align circuit 390 is implemented as a delay circuit that is capable of delaying an input to LDPC decoder 336 such that it is aligned with a defined boundary. Thus, for example, where decoder input 392 is to be aligned on a 4T boundary and phase align circuit 390 receives an input that is a 3T phase, phase align circuit 390 delays the input by 1T. As another example, where phase align circuit 390 receives an input that is a 2T phase, phase align circuit 390 delays the input by 2T. As yet another example, where phase align circuit 390 receives an input that is a 1T phase, phase align circuit 390 delays the input by 3T. As yet another example, where phase align circuit 390 receives an input that is a 4T phase, phase align circuit 390 merely passes the input through as decoder input 392. It should be noted that phase alignments other than 4T may be provided at decoder input 392 with corresponding modifications to the delays offered by phase align circuit 390.

While data from ping pong buffer 324 is being provided to LDPC decoder 336, the other ping pong buffer 324 holds a data set from data detector 308 that is currently being interleaved. Similarly, one of the buffers in ping pong buffer 332 holds the result of a prior interleaving process of the output from data detector 316 and is unloaded to LDPC decoder 336, while the other buffer of ping pong buffer 324 holds a data set from data detector 316 that is currently being interleaved.

LDPC decoder 336 is capable of decoding one or more data sets simultaneously. As an example, LDPC decoder 336 may be designed to decode an interleaved data set from ping pong buffer 324, or an interleaved data set from ping pong buffer 332, or to decode interleaved data sets from ping pong buffer 324 and ping pong buffer 332 simultaneously. The decoded data is either provided as a hard decision output 340 and/or to a de-interleaver circuit 344 that uses ping pong buffer 348 to de-interleave the decoded data and to provide the de-interleaved data as an input to data detector 316 via a phase shift circuit 380. One of the buffers in ping pong buffer 348 holds the result of a prior de-interleaving process and is unloaded to data detector 316, while the other buffer of ping pong buffer 348 holds a decoded data set currently being de-interleaved. Hard decision output 340 is provided to a de-interleaver circuit 356 that de-interleaves hard decision output 340 and stores the de-interleaved result in an output data buffer 360. Ultimately, de-interleaver circuit 356 provides the de-interleaved data stored in output data buffer 360 as an output 370.

The data received from de-interleaver circuit 344 is phase aligned consistent with the phase alignment performed by phase align circuit 390. Phase shift circuit 380 causes the data received from de-interleaver circuit 344 to be phase shifted such that the data phase presented to data detector 316 is different from the earlier data phase processed by data detector 308 or data detector 316 depending upon the stage of processing. In some cases, phase shift circuit is implemented as a delay circuit. In one embodiment, the phase change is controlled by a codeword latency count value 376. Codeword latency count value indicates the number of global iterations that have been applied to a given data set. This corresponds to the number of times the data set has been processed through data detector 308 and data detector 316. Codeword latency count 316 modulo the number of phase dependent detection processes or algorithms supported by data detector 316 can be used to determine the amount of phase shift to be applied by phase shift circuit 380. For example, where data detector 316 provides two phase dependent detection processes or algorithms, and the data set has only been passed through LDPC decoder 336 one time, phase shift circuit 380 may provide a 1T delay in the signal. As another example, where the data set has been passed through LDPC decoder 336 two times, phase shift circuit 380 may provide a 0T. In contrast, where data detector 316 provides four phase dependent detection processes or algorithms, and the data set has only been passed through LDPC decoder 336 one time, phase shift circuit 380 may provide a 1T delay in the signal; where the data set has been passed through LDPC decoder 336 two times, phase shift circuit 380 may provide a 2T; where the data set has been passed through LDPC decoder 336 three times, phase shift circuit 380 may provide a 3T; and where the data set has been passed through LDPC decoder 336 four times, phase shift circuit 380 may provide a 0T. Based upon the disclosure provided herein, one of ordinary skill in the art will recognize a variety of phase shifts that may be implemented by phase shift circuit 380 depending upon the number of phase dependent processes or algorithms supported by data detector 316.

In operation, a first data set is introduced via data input 304 to data detector 308. Data detector 308 performs its channel detection algorithm and provides both a hard output and a soft output to multiplexer 320. The hard and soft decision data is written to one buffer of ping pong buffer 324. At the same time the detector output is written into the buffer, interleaver 328 interleaves the data set by writing consecutive data into non-consecutive memory/buffer addresses based on the interleaver algorithm/mapping. Once interleaver 324 completes its interleaving process, the interleaved data is passed to LDPC decoder 336 via phase align circuit 390 that aligns the data along a phase boundary expected by LDPC decoder 336. The phase aligned data is decoded by LDPC decoder 336. Where the data converges, LDPC decoder 336 writes its output as hard decision output 340 to output data buffer 360 and the processing is completed for that particular data set. Alternatively, where the data does not converge, LDPC decoder 336 writes its output (both soft and hard) to ping pong buffer 348.

The data written to ping pong buffer 348 is fed back to data detector 316 via phase shift circuit 380. Phase shift circuit 380 applies a phase shift to the data such that when possible a new phase of the data is presented to data detector 316. Data detector 316 selects the data set that corresponds to the output in ping pong buffer 348 from input data buffer 312, phase aligns it with that provided from phase shift circuit 380, and performs a subsequent data detection aided by the soft output data generated by LDPC decoder 336 fed back from ping pong buffer 348. By using the previously generated soft data for data maintained in input data buffer 312, data detector 316 generally performs a subsequent channel detection with heightened accuracy. The output of this subsequent channel detection is passed to interleaver 328 via multiplexer 320. The data is written to one buffer of ping pong buffer 332, and interleaver 328 interleaves the data. The interleaved data is then passed to LDPC decoder 336 via phase align circuit 390 where it is decoded a second time. Similar to the first iteration, a decision is made as to whether the data converged or whether there is insufficient space in ping pong buffer 348 to handle the data. Where such is the case, LDPC decoder 336 writes its output as hard decision output 340 to output data buffer 360 and the processing is complete for that particular data set. Alternatively, where the data does not converge and there is sufficient buffer space in ping pong buffer 348 to receive an additional data set, LDPC decoder 336 writes its output (both soft and hard) to ping pong buffer 348 where it is passed back to data detector 316 for a third pass using, where possible, a different phase of the data presented to data detector 316 than was previously presented. Sufficient space is defined in ping pong buffer 348 by having at least reserved space for the data set from the first detector and decoder after the data set from the second detector and decoder is written into the ping pong buffer.

It should be noted that, as an example, a first data set may be applied at data input 304 and that it takes a number of iterations to converge while all subsequent data sets applied at data input 304 converge on the first pass (i.e., on a single iteration). In such a case, the first data set may be processed a number of times (i.e., a number of iterations) that is limited by the amount of memory available in output data buffer 360. Once output data buffer 360 is full or once an ordered set of outputs are available, the most recent hard decision output corresponding to the first data set is provided as a hard decision output and de-interleaver 356 re-orders the outputs putting the first output in the first phase. With this done, output data buffer 360 are flushed out as output 370. In some embodiments of the present invention, de-interleaver 356 does not perform a re-ordering function and output data buffer 360 has a very limited size. In such a case, it is conceivable that a data set could be processed a very large number times (i.e., a large number of iterations) only limited by how long a recipient of output 370 is willing to wait for the data. As another example, it is possible that all data applied as data input 304 converges on its first pass. In such a case, data detector 316, LDPC decoder 336 and/or de-interleaver 344 may be placed in a power saving mode to conserve power. As yet another example, it may be the case that all data sets applied at data input 304 fail to converge on the first pass (i.e., a single iteration). In such a case, all data sets would be iterated twice. It should also be noted that one or more additional data detectors may be added along with additional space in ping pong buffers 324, 332, 248 that would facilitate more iterations in the situation where a significant number of closely located data sets fail to converge. In such cases, all data sets can be guaranteed to be decoded with number of iterations the same as the number of detectors.

Based on the disclosure provided herein, it will be appreciated that queuing detection/decoding circuit 300 including phase shifting of the data prior to introducing the data at data detector 316 allows different detection processes or algorithms to be applied on each successive pass through data detector 316, with a corresponding change in the output of data detector 316. Such a system perturbation heightens the possibility of data convergence for where certain types of errors are exhibited by the data input.

Figure 4:
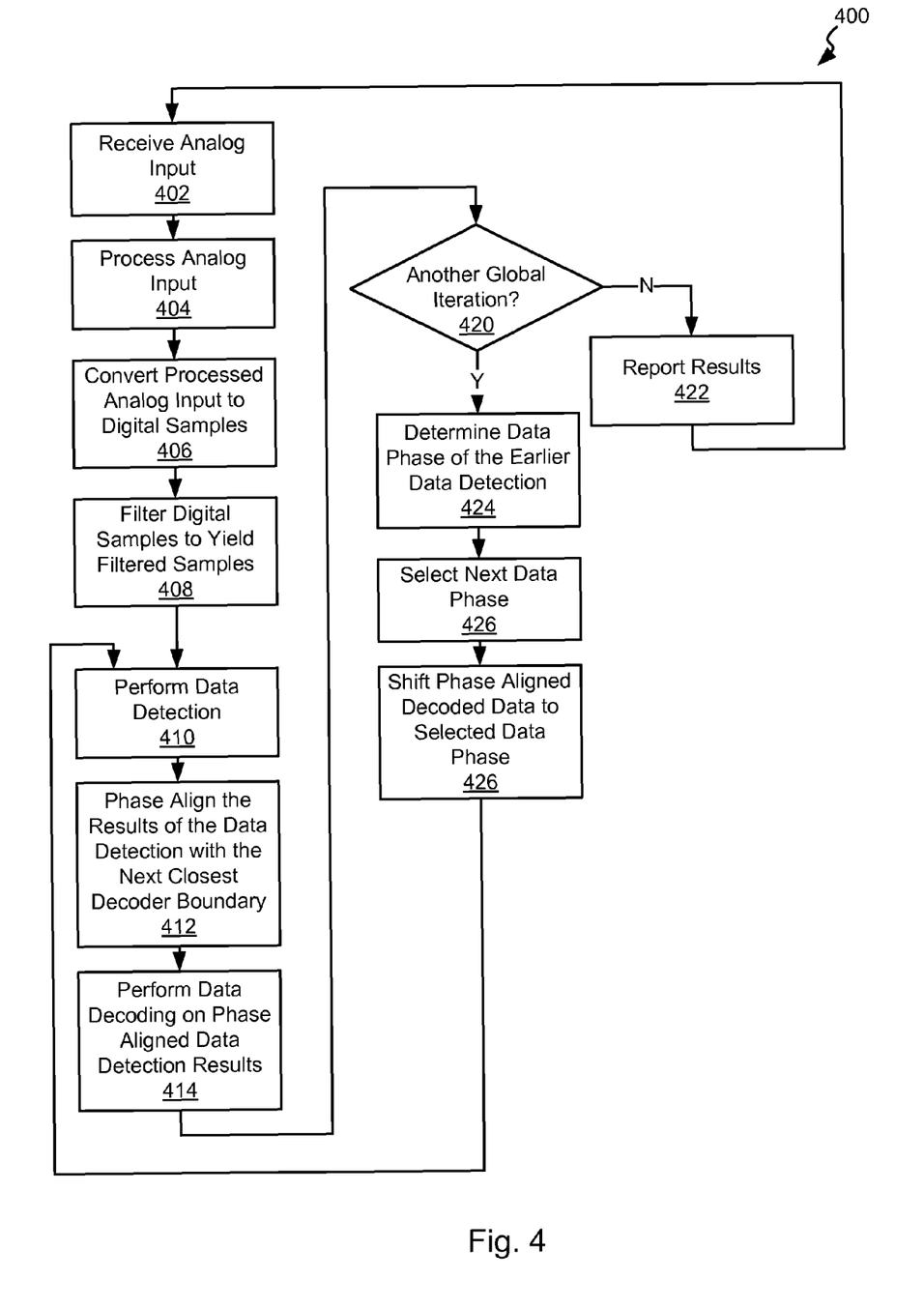
FIG. 4 is a flow diagram showing a process for multi-phase data detection processing in accordance with one or more embodiments of the present invention.

Turning to FIG. 4, a flow diagram 400 shows a process for multi-phase data detection processing in accordance with one or more embodiments of the present invention. Following flow diagram 400, an analog input is received (block 402). The analog input may be received from any of a number of different data sources. For example, where the method is implemented in a hard disk drive, the analog input may be derived from a storage medium. Alternatively, where the method is implemented in a data transmission system, the analog input may be derived from a receiver. Based upon the disclosure provided herein, one of ordinary skill in the art will recognize a variety of sources for the analog input. The analog input may be subject to various analog processing (block 404). Such processing may include, but is not limited to, amplification, equalization, and/or filtering as are known in the art. Based upon the disclosure provided herein, one of ordinary skill in the art will recognize a variety of analog processing that may be applied to the analog signal in accordance with different embodiments of the present invention.

The processed analog input is converted to a series of digital samples using an analog to digital converter (block 406). This process may be done using any approach known in the art for converting an analog signal into a series of corresponding digital samples. In some cases, the resulting digital samples are filtered (block 408). Such filtering may be done, for example, using a digital finite impulse response filter as are known in the art. The filtered data is presented to a data detection circuit where a data detection algorithm is applied to the data (block 410). The data detection circuit may be any data detection circuit known in the art that offers two or more phase dependent detection processes or algorithms. In some cases, the data detection circuit may be a soft output Viterbi algorithm detector (SOVA) or a maximum a posteriori (MAP) detector. For example, in some embodiments of the present invention, the data detector circuit operates on four samples at a time with a first detection process or algorithm applied to the first and third samples, and a second detection process or algorithm applied to the second and fourth samples. Thus, in this case, the output of the data detector circuit varies depending upon whether the particular input is in an odd phase or an even phase, and a change in the phases yields a different output. In other embodiments of the present invention, the data detector circuit operates on four samples at a time with a first detection process or algorithm applied to the first sample, a second detection process or algorithm applied to the second sample, a third detection process or algorithm applied to the third sample, and a fourth detection process applied to the fourth sample. Thus, in this case, the output of the data detector circuit varies depending upon whether the particular input is in the first, second, third or fourth phase, and a change in the phases yields a different output.

The output from the data detection process is then phase aligned to the next closest decoder boundary (block 412). For example, where the decoder boundaries are 4T boundaries, and the phase alignment of the output of the data detection process is on a 4T boundary, a 0T delay is applied to the output of the data detection process. Where the phase alignment of the output of the data detection process is on a 1T boundary, a 3T delay is applied to the output of the data detection process; where the phase alignment of the output of the data detection process is on a 2T boundary, a 2T delay is applied to the output of the data detection process; and where the phase alignment of the output of the data detection process is on a 3T boundary, a 1T delay is applied to the output of the data detection process. It should be noted that other boundaries may be used in relation to different embodiments of the present invention. The phase aligned output of the data detection process is then presented to a decoder circuit where a decoding algorithm is applied to the data (block 414). Any decoding process known in the art may be used. For example, the decoding process may be a low density parity check decoding process as is known in the art.

It is then determined whether another global iteration is to be performed (block 420). In the case where a fixed number of global iterations are performed, this includes determining whether all of the desired global iterations have already processed. Alternatively, in the case where a variable number of global iterations are possible, this includes determining whether the earlier processing converged or whether a maximum number of iterations have already been performed. Where no more global iterations are called for (block 420), the results of the processing are reported (block 422) and the process begins anew at block 402).

Alternatively, where additional global iterations are called for (block 420), the phase of the data presented in the prior data detection process(es) (block 410) is determined (block 424). For example, where the data detection process offers two phase dependent processes or algorithms, A and B, it is determined whether the first sample was processed using the A or B process. As another example, where the data detection process offers two phase dependent processes or algorithms, A, B, C and D, it is determined whether the first sample was processed using the A, B, C or D process. Based upon the determination of the previously applied data detection process(es), the next phase is selected (block 426). Using the two phase example above, where the first sample of the data processed during the previous processing had the A algorithm applied, then the first sample of the subsequent processing will have the B algorithm applied. The decoded data is phase shifted such that it aligns with the selected phase of the data detector (block 426). Having made this shift, the processes of blocks 410-420 are repeated. This process continues until no additional global iterations are desired (block 420).

Figure 5:
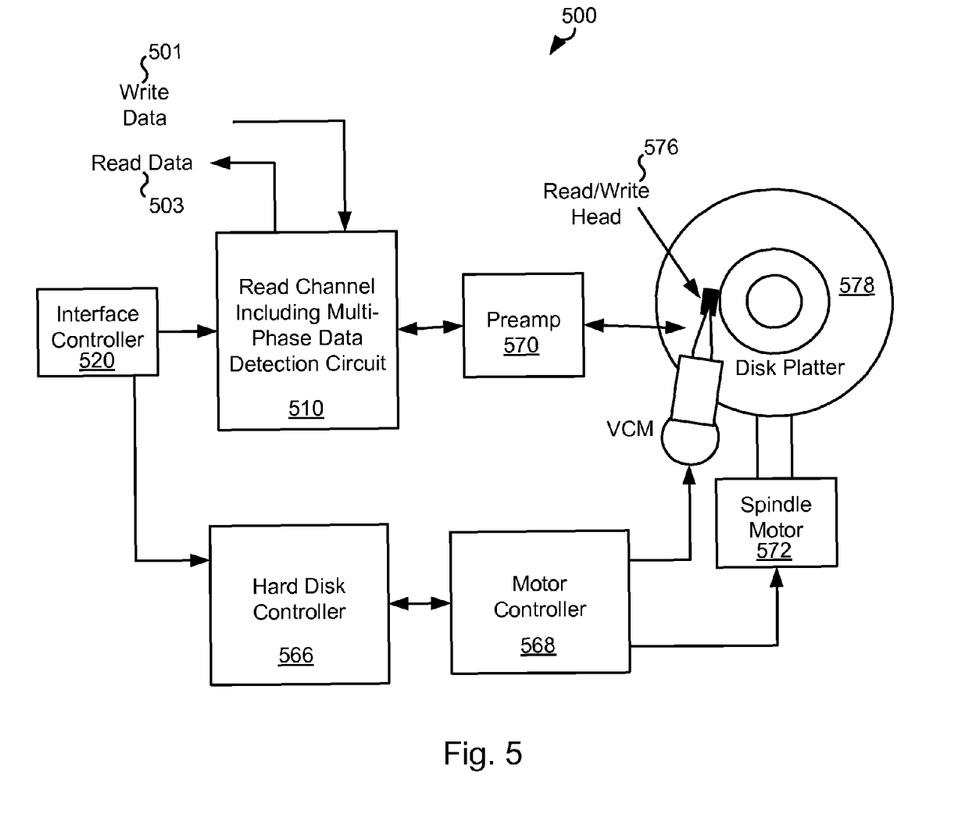
FIG. 5 depicts a storage system including a multi-phase data detection circuit in accordance with various embodiments of the present invention.

Turning to FIG. 5, a storage system 500 including a multi-phase data detection circuit is shown in accordance with various embodiments of the present invention. Storage system 500 may be, for example, a hard disk drive. Storage system 500 includes a read channel 510 with an incorporated multi-phase data detection circuit. The incorporated multi-phase data detection circuit may be any sampling update circuit capable of shifting the data phase fed to successive data detection iterations. Thus, for example, the incorporated multi-phase data detection circuit may be, but is not limited to, any of those described in relation to FIG. 1 or FIG. 3 above. In addition, storage system 500 includes an interface controller 520, a preamp 570, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs).

Once read/write head assembly 576 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel module 564 via preamp 570. Preamp 570 is operable to amplify the minute analog signals accessed from disk platter 578. In addition, preamp 570 is operable to amplify data from read channel module 510 that is destined to be written to disk platter 578. In turn, read channel module 510 decodes and digitizes the received analog signal to recreate the information originally written to disk platter 578. This data is provided as read data 503 to a receiving circuit. A write operation is substantially the opposite of the preceding read operation with write data 501 being provided to read channel module 510. This data is then encoded and written to disk platter 578.

Figure 6:
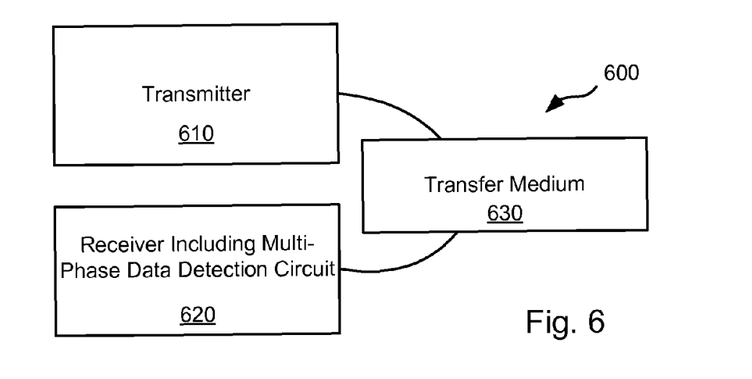
FIG. 6 depicts a communication system including a multi-phase data detection circuit in accordance with one or more embodiments of the present invention.

Turning to FIG. 6, a communication system 600 including a receiver 620 with a multi-phase data detection circuit in accordance with one or more embodiments of the present invention is shown. Communication system 600 includes a transmitter that is operable to transmit encoded information via a transfer medium 630 as is known in the art. The encoded data is received from transfer medium 630 by receiver 620. Receiver 620 incorporates a multi-phase data detection circuit. The incorporated multi-phase data detection circuit may be any sampling update circuit capable of shifting the data phase fed to successive data detection iterations. Thus, for example, the incorporated multi-phase data detection circuit may be, but is not limited to, any of those described in relation to FIG. 1 or FIG. 3 above.

In conclusion, the invention provides novel systems, devices, methods and arrangements for performing data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the circuit comprising:
    a first data detection circuit, wherein the first data detection circuit applies a phase dependent data detection algorithm to a data set such that a first output of the first data detection circuit varies depending upon a phase of the data set presented to the first data detection circuit, and wherein a first phase of the data set is presented to the first data detection circuit;
    a phase shift circuit, wherein the phase shift circuit phase shifts a derivative of the first output such that a second phase of the data set is provided as a phase shifted output; and
    a second data detection circuit, wherein the second data detection circuit applies a phase dependent data detection algorithm to the phase shifted output such that a second output of the second data detection circuit varies from the first output at least in part due to a different phase of the data set presented to the second data detection circuit.

2. The data processing circuit of claim 1, wherein the first data detection circuit is distinct from the second data detection circuit.

3. The data processing circuit of claim 1, wherein the first data detection circuit and the second data detection circuit are implemented as a single data detection circuit.

4. The data processing circuit of claim 1, wherein the data processing circuit further comprises:
    a decoder circuit, wherein the decoder circuit applies a decoding algorithm to the first output to yield a decoded output, and wherein the derivative of the first output is the decoded output.

5. The data processing circuit of claim 4, wherein the decoder is a low density parity check decoder.

6. The data processing circuit of claim 4, wherein the first data detection circuit is selected from a group consisting of: a SOVA detector circuit and a MAP detector circuit.

7. The data processing circuit of claim 1, wherein the first data detection circuit and the second data detection circuit offer two phase dependent detection processes.

8. The data processing circuit of claim 1, wherein the first data detection circuit and the second data detection circuit offer four phase dependent detection processes.

9. The data processing circuit of claim 1, wherein the data processing circuit is implemented as part of a hard disk drive.

10. The data processing circuit of claim 1, wherein the data processing circuit is implemented as part of a wireless receiving device.

11. The data processing circuit of claim 1, wherein the phase shift circuit is a delay circuit.

12. The data processing circuit of claim 11, wherein the delay circuit is a variable delay circuit operable to cause a data input to be shifted by a variable amount.

13. The data processing circuit of claim 4, wherein the circuit further comprises:
    a phase align circuit, wherein the phase align circuit is operable to align the first output to a decoder boundary prior to presenting the first output to the decoder circuit.

14. The data processing circuit of claim 13, wherein the decoder boundary is a 4T boundary.

15. The data processing circuit of claim 13, wherein the phase align circuit is a variable delay circuit.

16. A method for data processing, the method comprising:
    receiving a data set;
    performing a first data detection on the data set, wherein the first data detection is a phase dependent data detection resulting in a first output that varies depending upon a phase of the data set to which the first data detection is applied, and wherein the first data detection is applied to a first phase of the data set;
    performing a data decode on the first output to yield a decoded output;
    phase shifting the decoded output such that a second phase of the data set is provided as a phase shifted output; and
    performing a second data detection on the phase shifted output, wherein the second data detection is a phase dependent data detection resulting in a second output that varies depending upon a phase of a presented input.

17. The method of claim 16, wherein the method further comprises:
    phase aligning the first output such that the first output is aligned to a decoder boundary prior to presenting the first output to the decoder circuit.

18. The method of claim 17, wherein phase aligning the first output includes applying a variable delay to the first output.

19. The method of claim 16, wherein the first data detection and the second data detection are done using the same data detection circuit, and wherein the method further comprises:
    phase shifting the data set to align with a particular phase prior to performing the first data detection.

20. The method of claim 16, wherein phase shifting the decoded output includes applying a variable delay to the decoded output.

21. A hard disk drive system, the system comprising:
    a storage medium;
    a read/write head assembly disposed in relation to the storage medium;
    an analog to digital converter, wherein the analog to digital converter receives an analog input derived from the storage medium via the read/write head assembly and provides a data set corresponding to the analog input;
    a first data detection circuit, wherein the first data detection circuit applies a phase dependent data detection algorithm to the data set such that a first output of the first data detection circuit varies depending upon a phase of the data set presented to the first data detection circuit, and wherein a first phase of the data set is presented to the first data detection circuit;
    a decoder circuit, wherein the decoder circuit applies a decoding algorithm to the first output to yield a decoded output;
    a phase shift circuit, wherein the phase shift circuit phase shifts the decoded output such that a second phase of the data set is provided as a phase shifted output; and a second data detection circuit, wherein the second data detection circuit applies a phase dependent data detection algorithm to the phase shifted output such that a second output of the second data detection circuit varies from the first output at least in part due to a different phase of the data set presented to the second data detection circuit.

* * * * *